United States Patent
Jahier

(10) Patent No.: US 8,228,140 B2
(45) Date of Patent: Jul. 24, 2012

(54) METHOD AND DEVICE FOR OPTIMISING THE ADJUSTMENT TIME OF AN ADJUSTABLE FILTER

(75) Inventor: Vincent Jahier, St Leu la Foret (FR)

(73) Assignee: Thales, Neuilly sur Seine (FR)

( * ) Notice: Subject to any disclaimer, the term of this patent is extended or adjusted under 35 U.S.C. 154(b) by 391 days.

(21) Appl. No.: 12/519,097

(22) PCT Filed: Dec. 10, 2007

(86) PCT No.: PCT/EP2007/063625
§ 371 (c)(1),
(2), (4) Date: Sep. 25, 2009

(87) PCT Pub. No.: WO2008/071668
PCT Pub. Date: Jun. 19, 2008

(65) Prior Publication Data
US 2010/0060382 A1    Mar. 11, 2010

(30) Foreign Application Priority Data
Dec. 12, 2006   (FR) ...................................... 06 10810

(51) Int. Cl.
*H03H 7/01*    (2006.01)

(52) U.S. Cl. ....................................................... 333/175
(58) Field of Classification Search .................. 333/167, 333/172, 174, 175
See application file for complete search history.

(56) References Cited

U.S. PATENT DOCUMENTS

| | | |
|---|---|---|
| 3,541,451 A | 11/1970 | Lind |
| 4,612,571 A | 9/1986 | Moon |
| 2004/0127178 A1 | 7/2004 | Kuffner |

FOREIGN PATENT DOCUMENTS

| | | |
|---|---|---|
| GB | 1181386 A | 2/1970 |
| GB | 2100932 A | 1/1983 |
| WO | WO-03/038996 A | 5/2003 |

*Primary Examiner* — Benny Lee
*Assistant Examiner* — Gerald Stevens
(74) *Attorney, Agent, or Firm* — Stroock & Stroock & Lavan LLP

(57) ABSTRACT

A device associated with the control of a tractable filter, including: an induction coil having an inductance Ls, and a resistance Rs; a series resistance $r_{series}$ having a value determined from a parallel resistance of the induction coil, $L_o$, the inductance at the resonance frequency, $\omega_0$ the resonance frequency, and by taking the lowest resistance value and by deducing $r_{series}$ from $R=r_{series}+Rs$.

5 Claims, 2 Drawing Sheets

METHOD AND DEVICE FOR OPTIMISING THE ADJUSTMENT TIME OF AN ADJUSTABLE FILTER

CROSS-REFERENCE TO PRIOR APPLICATION

This is a U.S. National Phase Application under 35 U.S.C. §371 of International Application no. PCT/EP2007/063625, filed Dec. 10, 2007, and claims benefit of French Patent Application No. 06 10810, filed Dec. 12, 2006, both of which are incorporated herein. The International Application was published in French on Jun. 19, 2008 as WO 2008/071668 under PCT Article 21 (2).

BACKGROUND OF THE INVENTION

The invention relates to a method and a device for optimizing the tuning time of a tractable filter, a filter whose frequency response varies according to the control voltage of the filter.

PRIOR ART

Radiocommunication systems generally include an amplifier module, connected between, on the one hand, a radio frequency module, and on the other hand, an antenna system. The function of such a module is to amplify the useful signal in transmission as in reception. More particularly, the useful signal amplified that is transmitted via the antenna system must be strong enough to achieve the desired performance characteristics, and to occupy a frequency band corresponding to the wave form used in order to achieve the desired performance levels, notably in terms of desired bitrate, while observing the normative and regulatory constraints that are imposed. Generally, the systems are placed in environments where there are interfering transmitters nearby, the level of which can be high and cause phenomena that are damaging to the operation of the device.

To achieve the requisite performance levels, a capacitance-weighted filter, called a "tractable filter", which must respond rapidly according to its control voltage, is generally installed at the radio frequency input of the set.

The frequency response speed of the filter must be less than or equal to the frequency tuning time of the set in order not to degrade the speed characteristics of the set.

FIG. 1 shows, by a block diagram, a capacitance-weighted filter according to the state of the art. The filter comprises a main card 1. The main card 1 comprises an input E via which a signal to be filtered is received, and an output S on which a filtered signal is delivered. The main card 1 comprises two magnetically-coupled oscillating circuits. The main card 1 also includes capacitance weights (in FIG. 1, 8 capacitance weights for each oscillating circuit designated by the letters A to H). The number of capacitance weights is associated with the extent of the frequency band covered by the filter and the intrinsic frequency band of said filter. Each capacitance weight A . . . H comprises in FIG. 1 a capacitor and a diode. Each capacitance weight is controlled by signals received from a management and control card 2. The management and control card 2 converts the commands that it receives on inputs $C_A \ldots C_H$ into commands for the capacitance weights A . . . H. The management and control card 2 and the main card 1 are generally implemented on two interconnected separate electronic cards.

SUMMARY OF THE INVENTION

The invention relates to a device associated with the control of a tractable filter wherein it includes, in combination, at least the following elements:

an induction coil of series resistance value Rs and series inductance value Ls obtained as follows:

an inductance being represented by an inductance $L_p$, a resistance $R_p$, or a capacitance $C_p$ with the equations:

$$R_p = Q \cdot L \cdot \omega_0, \quad C_p = \frac{1}{L \cdot \omega_0^2}, \quad L_p = L \qquad (1)$$

with
Q, the overvoltage coefficient of the inductance,
L, the value of the inductance, a value that is initially chosen according to the working frequency and the application,
$\omega_0$, the working pulse frequency.

$$Y_{coil} = \frac{1}{R_p} + j\left(C_p \omega_0 - \frac{1}{L_p \omega_0}\right) \qquad (2)$$

equivalent admittance of the induction coil, assuming $Y_{coil} = \alpha - j\beta$ $$Z_{coil} = \frac{1}{Y_{coil}} = \left(\frac{\alpha}{\alpha^2 + \beta^2}\right) + j\left(\frac{\beta}{\alpha^2 + \beta^2}\right) \qquad (3)$$

equivalent impedance of the induction coil,
the value of $$R_s = \frac{\alpha}{\alpha^2 + \beta^2} \quad \text{and} \quad L_s = 1 \Big/ \omega_0 \left[\frac{\beta}{\alpha^2 + \beta^2}\right]$$

is deduced
a series resistance $r_{series}$, the value of which is determined from the expression:

$$\frac{0.99 \cdot R_p \pm \sqrt{(0.99 R_p)^2 - 4 \cdot l_0^2 \omega_0^2}}{2}$$

where Rp corresponds to the parallel resistance of the induction coil, $L_o$, the inductance at the resonance frequency, $\omega_0$ the resonance frequency, and by taking the lowest resistance value and by deducing $r_{series}$ from $R = r_{series} + Rs$.

The invention notably offers the following benefits:
it makes it possible to achieve fast tuning times for the filter with which it is associated, by limiting the resonances of the induction coil in its frequency response;
it makes it possible to isolate the RF part from the DC part, better known by the expression "choking" the control voltage.

DESCRIPTION OF THE DRAWINGS

Other features and benefits of the present invention will become more apparent from reading the following description of an exemplary embodiment given by way of illustration and in a non-limiting manner, with appended figures that represent.

DETAILED DESCRIPTION

The device according to one or more embodiments of the invention is positioned at the level of the control of the tractable filter and for a device implemented on an SMC printed circuit. The device includes an assembly made from an induction coil and a series resistance, the values R and L of which are determined as described hereinbelow.

Figure 1:
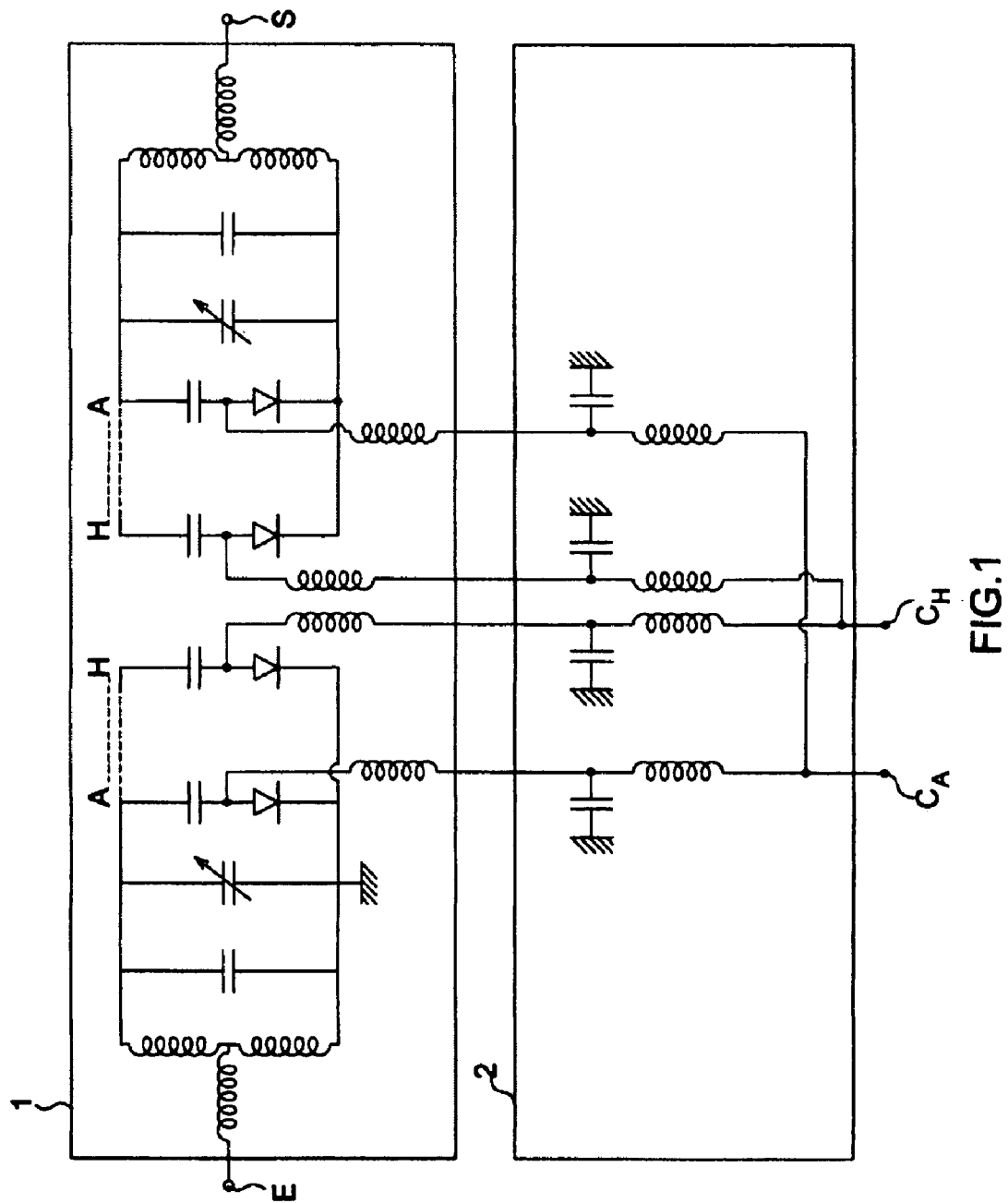
FIG. 1, the block diagram of a tractable filter,
FIG. 2, a representation of an inductance, FIG. 3, a diagram of the various elements that make up the tuning device associated with the control of the tractable filter.
Figure 2:
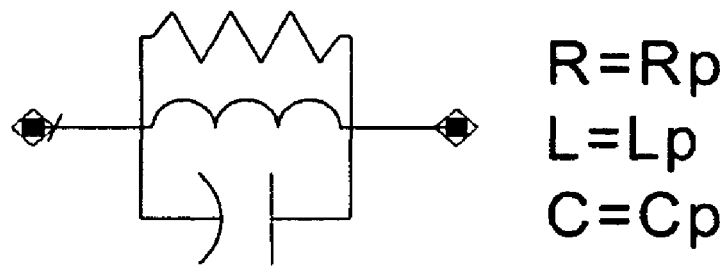

An SMC inductance can be represented by $L_P$, $R_P$, $C_p$ (FIG. 2, the indices p designating a parallel scheme) with the equations:

$$R_p = Q \cdot L \cdot \omega_0 \cdot C_p = \frac{1}{L \cdot \omega_0^2}, L_p = L \quad (1)$$

with

Q, the overvoltage coefficient of the inductance,
L, the value of the inductance, a value initially chosen according to the working frequency and the application,
$\omega_0$, the working pulse frequency.

$$Y_{coil} = \frac{1}{R_p} + j\left(C_p\omega_0 - \frac{1}{L_p\omega_0}\right) \quad (2)$$

equivalent admittance of the induction coil,
assuming $Y_{coil} = \alpha - j\beta$ $$Z_{coil} = \frac{1}{Y_{coil}} = \left(\frac{\alpha}{\alpha^2 + \beta^2}\right) + j\left(\frac{\beta}{\alpha^2 + \beta^2}\right) \quad (3)$$

equivalent impedance of the induction coil, if $R_s = \frac{\alpha}{\alpha^2 + \beta^2}$ and $L_s \cdot \omega_0 = \frac{\beta}{\alpha^2 + \beta^2}$, then $$Z_{coil} = R_s + j \cdot L_s \cdot \omega_0 \quad (4)$$

the method therefore includes inserting a series resistance ($r_{series}$) in series with the SMC inductance.

Figure 3:
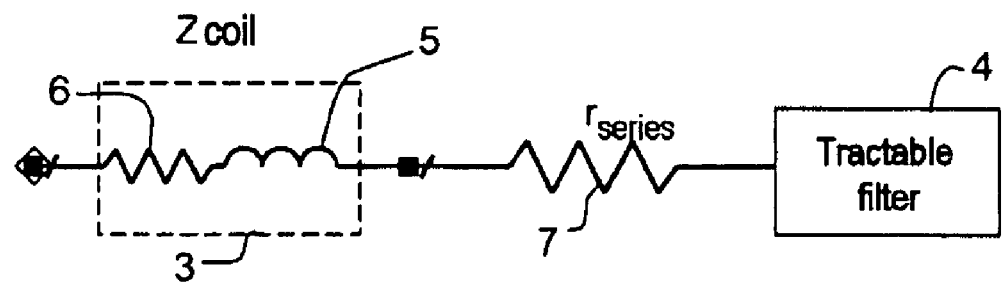

FIG. 3 schematically represents an exemplary device 3 according to one or more embodiments of the invention associated with the control of a tractable filter 4. The device 3 includes an inductance coil of $Z_{coil}$ having an inductance Ls, 5, and a resistance Rs, 6, in series with a resistance $r_{series}$, 7.

The equivalent scheme is:

$$Z_{equivalent} = Z_{coil} + r_{series} = r_{series} + R_s + j \cdot L_s \cdot \omega_0 \quad (5)$$

assuming $R = r_{series} + R_s$, $Z_{equivalent} = R + jl_0\omega_0$ $$Y_{equivalent} = \frac{1}{Z_{equivalent}} = \left(\frac{R}{R^2 + l_0^2\omega_0^2}\right) - j\left(\frac{l_0\omega_0}{R^2 + l_0^2\omega_0^2}\right) \quad (6)$$

assuming that if $$\frac{R^2 + l_0^2\omega_0^2}{R} = 99\% \cdot R_p,$$

the characteristics of the SMC inductance are little degraded by the addition of the series resistance.

It is possible to obtain both values R1 and R2 defined by $$R_{1,2} = \frac{0.99 \cdot R_p \pm \sqrt{(0.99R_p)^2 - 4 \cdot l_0^2\omega_0^2}}{2}$$

The method according to one or more embodiments of the invention then includes selecting the lowest resistance value and, from the equation $R = r_{series} + Rs$, deducing therefrom $r_{series}$.

The next step is to select the standardized resistance value—for example, the closest value.

Any type of surface mount component (or SMC) resistance, or any other, can be used to implement one or more embodiments of the present invention. Similarly, any type of SMC or other inductance can be used in one or more embodiments of the present invention.

The invention claimed is:

1. A device associated with the control of a tractable filter, comprising:
an induction coil having a series resistance, a series inductance, a parallel resistance, a parallel inductance and a parallel capacitance that are determined in accordance with the following relationships:

$$R_p = Q \cdot L \cdot \omega_0;$$

$$C_p = \frac{1}{L \cdot \omega_0^2};$$

$$L_p = L;$$

$$Y_{coil} = \frac{1}{R_p} + j\left(C_p\omega_0 = \frac{1}{L_p\omega_0}\right);$$

$$\alpha = \frac{1}{R_p};$$

$$\beta = -\left(C_p\omega_0 - \frac{1}{L_p\omega_0}\right);$$

$$Z_{coil} = \frac{1}{Y_{coil}} = \left(\frac{\alpha}{\alpha^2 + \beta^2}\right) + j\left(\frac{\beta}{\alpha^2 + \beta^2}\right);$$

$$R_s = \frac{\alpha}{\alpha^2 + \beta^2}; \text{ and}$$

$$L_s = 1 \Big/ \omega_0\left[\frac{\beta}{\alpha^2 + \beta^2}\right];$$

wherein:
Q is an overvoltage coefficient of the inductance;
L is an initial inductance value that is chosen in accordance with a working resonant frequency and the application;
$\omega_0$ is the working resonant frequency;
$L_p$ is a parallel inductance value of the induction coil;
$R_p$ is a parallel resistance value of the induction coil;

$C_p$ is a parallel capacitance value of the induction coil;
$Y_{coil}$ is an equivalent admittance of the induction coil;
$Z_{coil}$ is an equivalent impedance of the induction coil;
$R_s$ is a series resistance value of the induction coil; and
$L_s$ is a series inductance value of the induction coil; and
a series resistance in series with the induction coil, the series resistance having a value determined in accordance with the following relationships:

$$R = \frac{0.99 \cdot R_p \pm \sqrt{(0.99 R_p)^2 - 4 \cdot L_0^2 \omega_0^2}}{2};$$

and $$r_{series} = R - Rs$$

wherein:
$R_p$ is the parallel resistance of the induction coil;
$L_0$ is the inductance of the induction coil at a resonant frequency;
$\omega_0$ is the working resonant frequency;
$r_{series}$ is the series resistance in series with the induction coil; and
R is a lowest resistance value solution to the respective relationship.

2. The device as claimed in claim 1, wherein the series resistance is a resistance produced as a surface mount component.

3. The device as claimed in claim 1, wherein the induction coil is an SMC inductance.

4. A method for determining a device associated with a tractable filter, comprising the steps of:
  choosing an induction coil having a series resistance and a series inductance that are determined in accordance with the following relationships:

$$R_p = Q \cdot L \cdot \omega_0;$$

$$C_p = \frac{1}{L \cdot \omega_0^2};$$

$$L_p = L;$$

$$Y_{coil} = \frac{1}{R_p} + j\left(C_p\omega_0 = \frac{1}{L_p\omega_0}\right);$$

$$\alpha = \frac{1}{R_p};$$

-continued $$\beta = -\left(C_p\omega_0 - \frac{1}{L_p\omega_0}\right);$$

$$Z_{coil} = \frac{1}{Y_{coil}} = \left(\frac{\alpha}{\alpha^2 + \beta^2}\right) + j\left(\frac{\beta}{\alpha^2 + \beta^2}\right);$$

$$R_s = \frac{\alpha}{\alpha^2 + \beta^2}; \text{ and}$$

$$L_s = 1 \bigg/ \omega_0 \left[\frac{\beta}{\alpha^2 + \beta^2}\right];$$

wherein:
Q is an overvoltage coefficient of the inductance;
L is an initial inductance value that is chosen in accordance with a working resonant frequency and the application;
$\omega_0$ is the working resonant frequency;
$L_p$ is a parallel inductance value of the induction coil;
$R_p$ is a parallel resistance value of the induction coil;
$C_p$ is a parallel capacitance value of the induction coil;
$Y_{coil}$ is an equivalent admittance of the induction coil;
$Z_{coil}$ is an equivalent impedance of the induction coil;
$R_s$ is a series resistance value of the induction coil; and
$L_s$ is a series inductance value of the induction coil; and
determining a value for a series resistance $r_{series}$ in series with the induction coil, the value determined in accordance with the following relationships:

$$R = \frac{0.99 \cdot R_p \pm \sqrt{(0.99 R_p)^2 - 4 \cdot L_0^2 \omega_0^2}}{2};$$

and
wherein:
Rp is the parallel resistance of the induction coil;
$L_o$ is the inductance of the induction coil at a resonant frequency;
$\omega_0$ is the working resonant frequency;
the method further comprising the steps of:
  choosing the lowest resistance value solution R to the respective relationship; and
  calculating $$r_{series} = R - Rs.$$

5. The method as claimed in claim 4, further comprising using surface mount components for the induction coil and for the series resistance.

* * * * *